(12) United States Patent
Goto et al.

(10) Patent No.: US 10,763,804 B2
(45) Date of Patent: Sep. 1, 2020

(54) AUDIO PROCESSING DEVICE AND METHOD FOR CONTROLLING AUDIO PROCESSING DEVICE

(71) Applicant: Yamaha Corporation, Hamamatsu-shi (JP)

(72) Inventors: Mitsutaka Goto, Hamamatsu (JP); Kazuhiro Yanaike, Hamamatsu (JP)

(73) Assignee: YAMAHA CORPORATION, Hamamatsu-Shi (JP)

( * ) Notice: Subject to any disclaimer, the term of this patent is extended or adjusted under 35 U.S.C. 154(b) by 0 days.

(21) Appl. No.: 16/686,848

(22) Filed: Nov. 18, 2019

(65) Prior Publication Data

US 2020/0091877 A1  Mar. 19, 2020

Related U.S. Application Data

(63) Continuation of application No. PCT/JP2017/018877, filed on May 19, 2017.

(51) Int. Cl.
*H03F 3/217* (2006.01)
*H04R 3/00* (2006.01)
*H04R 3/04* (2006.01)

(52) U.S. Cl.
CPC ............. *H03F 3/217* (2013.01); *H04R 3/04* (2013.01); *H03F 2200/03* (2013.01);
(Continued)

(58) Field of Classification Search
CPC . H04R 3/00; H04R 3/007; H04R 3/04; H04R 29/00; H04R 29/001;
(Continued)

(56) References Cited

U.S. PATENT DOCUMENTS

| 6,026,170 A | * | 2/2000 | Dieken | A61B 7/04 181/126 |
| 6,587,670 B1 | * | 7/2003 | Hoyt | H03F 1/0261 455/63.1 |

(Continued)

FOREIGN PATENT DOCUMENTS

| JP | H10126893 A | 5/1998 |
| JP | 2005509306 A | 4/2005 |

(Continued)

OTHER PUBLICATIONS

International Search Report issued in Intl. Appln. No. PCT/JP2017/018877 dated Aug. 8, 2017. English translation provided.

(Continued)

*Primary Examiner* — Thang V Tran
(74) *Attorney, Agent, or Firm* — Rossi, Kimms & McDowell LLP

(57) ABSTRACT

An audio processing device includes: a signal processing circuit configured to select between a first state for outputting a first signal obtained by reducing components that fall below a first frequency in an audio signal and a second state for outputting a second signal obtained by reducing components that fall below a second frequency in the audio signal, and output one of the selected first or second signal as an output signal, where the second frequency is higher than the first frequency; a class-D amplifier that amplifies the output signal; a processor configured to: determine whether or not an intensity of a low-frequency component in the audio signal exceeds a threshold value; and control the signal processing circuit to select: the first state in a case where a determination result is negative, where the intensity of the low-frequency component in the audio signal is determined to not exceed the threshold value; and the second state in a case where the determination result is affirmative, (Continued)

where the intensity of the low-frequency component in the audio signal is determined to exceed the threshold value.

4 Claims, 11 Drawing Sheets

(52) U.S. Cl.
CPC .. *H03F 2200/165* (2013.01); *H03F 2200/267* (2013.01); *H03F 2200/351* (2013.01)

(58) Field of Classification Search
CPC ..... H04R 2420/01; H03F 3/183; H03F 3/217; H03F 3/2171; H03F 3/2173; H03F 3/2175; H03F 2200/03; H03F 2200/165; H03F 2200/267; H03F 2200/333; H03F 2200/351
See application file for complete search history.

(56) References Cited

U.S. PATENT DOCUMENTS

| | | | |
|---|---|---|---|
| 6,683,494 B2 | 1/2004 | Stanley | |
| 6,920,224 B2 * | 7/2005 | Oki | H03G 5/00 381/123 |
| 7,190,224 B2 * | 3/2007 | Sutardja | H03F 3/217 330/207 A |
| 9,263,992 B1 * | 2/2016 | Breece | H03F 1/0205 |
| 2004/0047477 A1 * | 3/2004 | Bank | H03F 3/2178 381/120 |
| 2005/0152561 A1 * | 7/2005 | Spencer | H03F 3/66 381/77 |
| 2015/0109056 A1 * | 4/2015 | Lesso | H03F 1/0211 330/251 |

FOREIGN PATENT DOCUMENTS

| | | |
|---|---|---|
| JP | 5233309 B2 | 7/2013 |
| JP | 2014154959 A | 8/2014 |
| WO | 02078179 A2 | 10/2002 |

OTHER PUBLICATIONS

Written Opinion issued in Intl. Appln. No. PCT/JP2017/018877 dated Aug. 8, 2017.

* cited by examiner

AUDIO PROCESSING DEVICE AND METHOD FOR CONTROLLING AUDIO PROCESSING DEVICE

CROSS REFERENCE TO RELATED APPLICATION

This application is a Continuation Application of PCT Application No. PCT/JP2017/018877, filed May 19, 2017, the entire contents of which are incorporated herein by reference.

BACKGROUND

Field of the Invention

The present invention relates to a technique for processing audio signals.

Description of Related Art

There has been proposed a class-D amplifier including a Pulse Width Modulation (PWM) circuit for modulating an audio signal to a binary signal, a switch circuit that is switched by the modulated binary signal, and a low-pass filter for reducing a high-frequency component in the output signal from the switch circuit. In a half-bridge type (single-end type) class-D amplifier, the low-pass filter has an inductor, and a smoothing capacitor of the power supply voltage may be overcharged by a regenerative current from the inductor constituting the low-pass filter. As a result, a phenomenon in which the power supply voltage fluctuates (hereinafter referred to as "power supply pumping phenomenon") may occur.

Japanese Patent No. 5233309 (hereinafter, Patent Document 1) discloses a class-D power amplifier that reduces a fluctuation in power supply voltage due to a power supply pumping phenomenon, by controlling a cutoff frequency of a high-pass filter for reducing a low-frequency component of an input audio signal. In the technique of Patent Document 1, the fluctuation in the power supply voltage is monitored to determine whether or not there is an on-going power supply pumping phenomenon. When a power supply pumping phenomenon occurs, the cutoff frequency of the high-pass filter is increased stepwise, thereby reducing the fluctuation in the power supply voltage due to the power supply pumping phenomenon.

However, in the technique of Patent Document 1, the presence or absence of a power supply pumping phenomenon is determined by monitoring fluctuation in the power supply voltage. Therefore, there is a problem in that the control for reducing the fluctuation in the power supply voltage due to the power supply pumping phenomenon is not started until the power supply pumping phenomenon is actually generated.

SUMMARY

In view of the above-described circumstances, an object of the present invention is to reduce fluctuation (ideally, prevent fluctuation) in a power supply voltage due to a power supply pumping phenomenon.

In order to solve the above problem, an audio processing device according to an aspect of the present invention includes: a signal processing circuit configured to select between a first state for outputting a first signal obtained by reducing components that fall below a first frequency in an audio signal and a second state for outputting a second signal obtained by reducing components that fall below a second frequency in the audio signal, and output one of the selected first or second signal as an output signal, where the second frequency is higher than the first frequency; a class-D amplifier that amplifies the output signal; a processor configured to: determine whether or not an intensity of a low-frequency component in the audio signal exceeds a threshold value; and control the signal processing circuit to select: the first state in a case where a determination result is negative, where the intensity of the low-frequency component in the audio signal is determined to not exceed the threshold value; and the second state in a case where the determination result is affirmative, where the intensity of the low-frequency component in the audio signal is determined to exceed the threshold value.

An aspect of the present invention provides a method of controlling an audio processing device including: a signal processing circuit configured to select between a first state for outputting a first signal obtained by reducing components that fall below a first frequency in an audio signal and a second state for outputting a second signal obtained by reducing components that fall below a second frequency in the audio signal, and output one of the selected first or second signal as an output signal, where the second frequency is higher than the first frequency; and a class-D amplifier that amplifies the output signal, wherein the method comprises: determining whether or not the intensity of a low-frequency component in the audio signal exceeds a threshold value, and controlling the signal processing circuit to select the first state in a case where a determination result is negative, where the intensity of the low-frequency component in the audio signal is determined to not exceed the threshold value; and controlling the signal processing circuit to select the second state in a case where the determination result is affirmative, where the intensity of the low-frequency component in the audio signal is determined to exceed the threshold value.

DESCRIPTION OF THE EMBODIMENTS

First Embodiment

Figure 1:
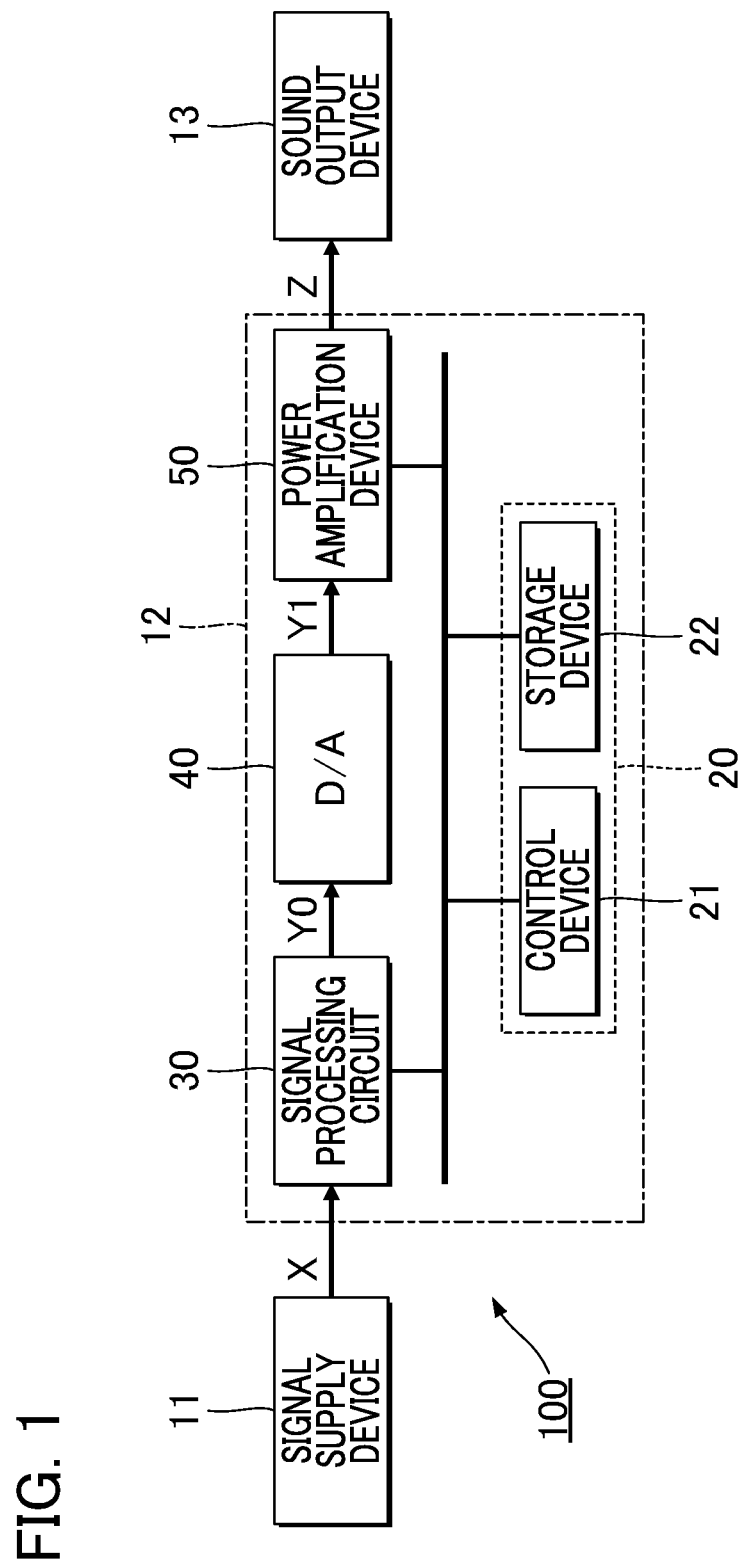
FIG. 1 is a block diagram of an audio system according to a first embodiment of the present invention.

FIG. 1 is a block diagram of an audio system 100 according to a first embodiment of the present invention. As shown in FIG. 1, the audio system 100 according to the first embodiment is a computer system for playing various sounds such as musical sounds, vocal sounds, or the like. The audio system 100 includes a signal supply device 11, an audio processing device 12, and a sound output device 13. Any two or more elements of the audio system 100 may be formed unitarily. For example, the signal supply device 11 may be mounted on the audio processing device 12.

The signal supply device 11 is a signal source that supplies a digital audio signal X representing various sounds, such as vocal sounds or musical sounds, to the audio processing device 12. Examples of the signal supply device 11 include a player that reads an audio signal X from a portable or built-in recording medium. Alternatively, there may be used, as the signal supply device 11, a sound collecting device that collects sound in the periphery to generate an audio signal X or a communication device that receives an audio signal X from another device via a communication network.

The audio processing device 12 processes the audio signal X supplied from the signal supply device 11 to generate an audio signal Z. The sound output device 13 is, for example, a speaker or a headphone. The sound output device 13 plays sound representative of the audio signal Z generated by the audio processing device 12.

As shown in FIG. 1, the audio processing device 12 includes a control unit 20, a signal processing circuit 30, a D/A converter 40, and a power amplification device 50. The audio signal X output from the signal supply device 11 is supplied to the signal processing circuit 30. In a case where an output of the signal supply device 11 is an analog audio signal X, there may be provided an A/D converter (not shown) that converts the audio signal X from analog to digital. In this case, the signal processing circuit 30 receives a supply of the digital audio signal X converted by the A/D converter.

The control unit 20 is a controller configured to control each element of the audio processing device 12. The control unit 20 includes a control device (an example of "a processor") 21 and a storage device 22. The control device 21 is an arithmetic processing circuit such as a Central Processor Unit (CPU), for example. The control device 21 controls the signal processing circuit 30 and the power amplification device 50 by executing a program stored in the storage device 22. The storage device 22 stores therein a program to be executed by the control device 21 and various data used by the control device 21. For example, there may be used, as the storage device 22, a known recording medium, such as a semiconductor recording medium or a magnetic recording medium, or a combination of a plurality of types of recording media.

The signal processing circuit 30 is configured by, for example, a Digital Signal Processor (DSP) for audio signal processing. The signal processing circuit 30 performs signal processing on the audio signal X supplied from the signal supply device 11, to an audio signal Y0. Examples of the signal processing performed by the signal processing circuit 30 include crossover processing for dividing the audio signal X into bands, delay processing for delaying the audio signal X, equalizer processing for adjusting the frequency characteristics of the audio signal X, limiter processing for limiting a voltage range of an audio signal X, or howling suppression processing for suppressing howling. A part or all of the functions of the signal processing circuit 30 may be realized by the control device 21.

The D/A converter 40 in FIG. 1 converts the digital audio signal Y0 generated by the signal processing circuit 30 into an analog audio signal Y1. The power amplification device 50 generates an audio signal Z by amplifying the audio signal Y1. The sound output device 13 receives a supply of the audio signal Z amplified by the power amplification device 50.

Figure 2:
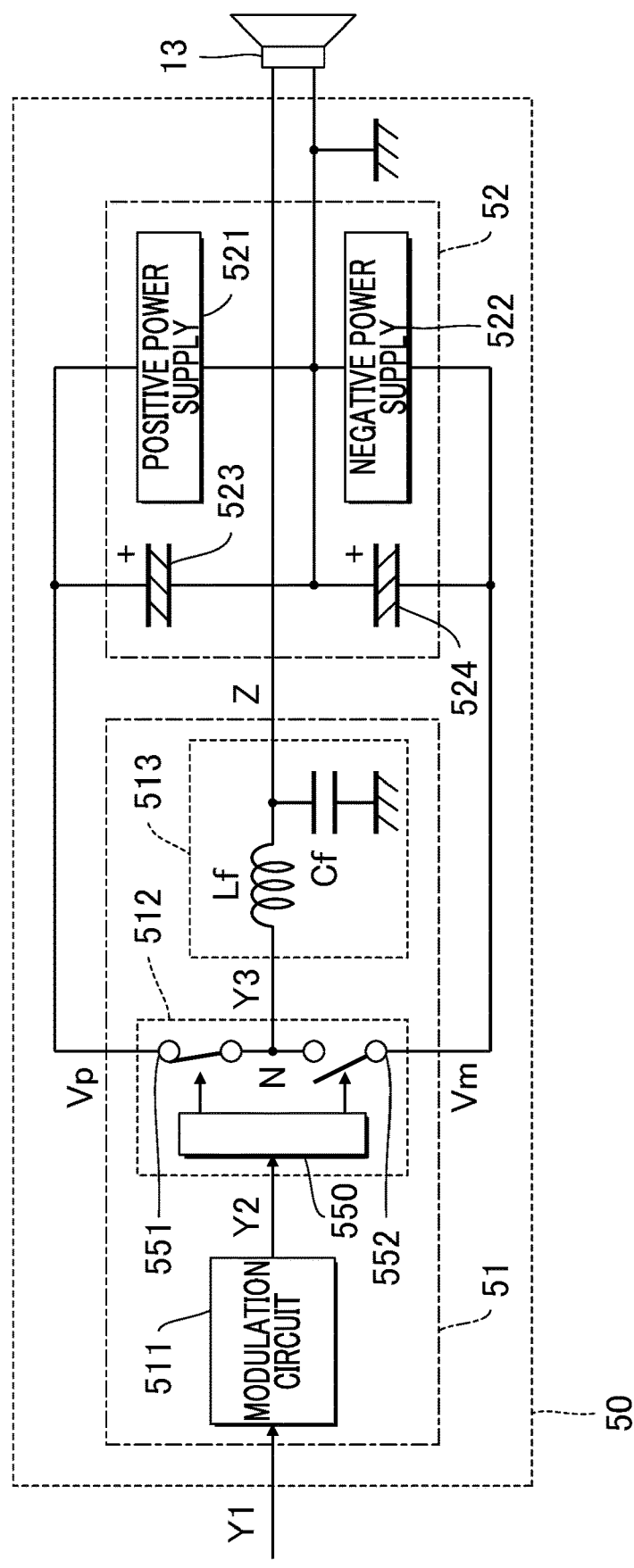
FIG. 2 is a block diagram showing a power amplification device.

FIG. 2 is a block diagram showing the power amplification device 50. As shown in FIG. 2, the power amplification device 50 according to the first embodiment includes a class-D amplifier 51 and a power source 52. The class-D amplifier 51 amplifies the audio signal Y1 supplied from the D/A converter 40 to generate an audio signal Z. The power source 52 supplies power to the class-D amplifier 51. Specifically, the class-D amplifier 51 receives supplies of a positive power supply voltage Vp and a negative power supply voltage Vm from the power source 52.

As shown in FIG. 2, the power source 52 includes a positive power supply 521, a negative power supply 522, a smoothing capacitor 523, and a smoothing capacitor 524. The positive power supply 521 generates a positive power supply voltage Vp, and the negative power supply 522 generates a negative power supply voltage Vm. The smoothing capacitor 523 has a capacitance for smoothing the positive power supply voltage Vp. The smoothing capacitor 524 has a capacitance for smoothing the negative power supply voltage Vm. For example, an electrolytic capacitor may be used as the smoothing capacitor 523 and the smoothing capacitor 524.

As shown in FIG. 2, the class-D amplifier 51 according to the first embodiment is a half-bridge type (single-end type) digital amplifier. The class-D amplifier 51 includes a modulation circuit 511, a switching circuit 512, and a low-pass filter 513. The modulation circuit 511 generates a Pulse Width Modulation (PWM) signal Y2 by pulse width modulation with respect to the audio signal Y1. The PWM signal Y2 is a binary signal which fluctuates with a duty ratio corresponding to the level of the audio signal Y1. Specifically, there may be used, as the modulation circuit 511, the PWM circuit of the triangular wave comparison type (other excited oscillation type) which generates the PWM signal Y2 by comparing the audio signal Y1 with the triangular wave, or a self-excited oscillation PWM circuit which generates the PWM signal Y2 by the self-excited oscillation by the negative feedback.

The switching circuit 512 amplifies the PWM signal Y2 generated by the modulation circuit 511 by a switching operation, thereby generating an amplified signal Y3. The switching circuit 512 according to the first embodiment includes a drive circuit 550, a first switch 551, and a second switch 552. Each of the first switch 551 and the second switch 552 is a switching element such as a Metal Oxide Semiconductor Field Effect Transistor (MOSFET), for example. The first switch 551 is interposed between the positive power supply 521 and an output point N. The second switch 552 is interposed between the negative power supply 522 and the output point N. The drive circuit 550 controls either of the first switch 551 and the second switch 552 to be in the ON state in accordance with the PWM signal Y2 generated by the modulation circuit 511. Specifically, the drive circuit 550 controls the first switch 551 to be in the ON state when the PWM signal Y2 is at a high level, and controls the second switch 552 to be in the ON state when the PWM signal Y2 is at a low level. When the first switch 551 is controlled to be in the ON state, the positive power supply voltage Vp is applied to the output point N. When the second switch 552 is controlled to be in the ON state, the negative power supply voltage Vm is applied to the output point N. That is, the amplified signal Y3 generated at the output point N is a rectangular wave that changes from one of the positive power supply voltage Vp and the negative power supply voltage Vm to the other at a duty ratio similar to that of the PWM signal Y2.

The low-pass filter 513 generates an audio signal Z obtained by reducing a high-frequency component of the amplified signal Y3 that is generated by the class-D amplifier 51. It is of note that the high-frequency components of the amplified signal Y3 are, for example, the band component including the oscillation frequency of the modulation circuit 511. That is, the low-pass filter 513 extracts the low-frequency component including the audible band from the amplified signal Y3, as the audio signal Z. As shown in FIG. 2, the low-pass filter 513 includes a capacitor Cf and an inductor Lf.

In the class-D amplifier 51 having the structure shown above, a power supply pumping phenomenon may occur. The power supply pumping phenomenon will be described below. The power supply pumping phenomenon is a phenomenon in which the positive power supply voltage Vp and the negative power supply voltage Vm fluctuate. This phenomenon is caused by overcharging the smoothing capacitor 523 and the smoothing capacitor 524 by a regenerative current from the inductor Lf of the low-pass filter 513. Assuming that a sine wave is supplied to the load (e.g., sound output device 13) from the class-D amplifier 51, the fluctuation amount ΔV of the negative power supply voltage Vm due to the power supply pumping phenomenon is expressed by the following Equation (1). Although the variation amount of the negative power supply voltage Vm is shown in Equation (1), similar fluctuations may also occur in the positive power supply voltage Vp.

$$\Delta V = \frac{Vs(4Vdd - \pi Vs)}{8\pi fCR_L V} \quad (1)$$

In Equation (1), the symbol Vs is the peak voltage [V] of the sine wave, and the symbol Vdd is the absolute value of the positive power supply voltage Vp or the negative power supply voltage Vm. The symbol f is the frequency [Hz] of the sine wave. Further, the symbol C is a capacitance value [F] of the smoothing capacitor 524, and the symbol RL is a load resistance [Ω]. As will be understood from Equation (1), the lower the frequency of the audio signal Z output from the class-D amplifier 51 is, the more the fluctuation amount ΔV (that is, an impact of the power supply pumping phenomenon) of the positive power supply voltage Vp or the negative power supply voltage Vm tends to be increased. Therefore, by reducing the low-frequency component in the audio signal X before amplification by the class-D amplifier 51, it is possible to reduce the fluctuation in the power supply voltage due to the power supply pumping phenomenon.

Figure 3:
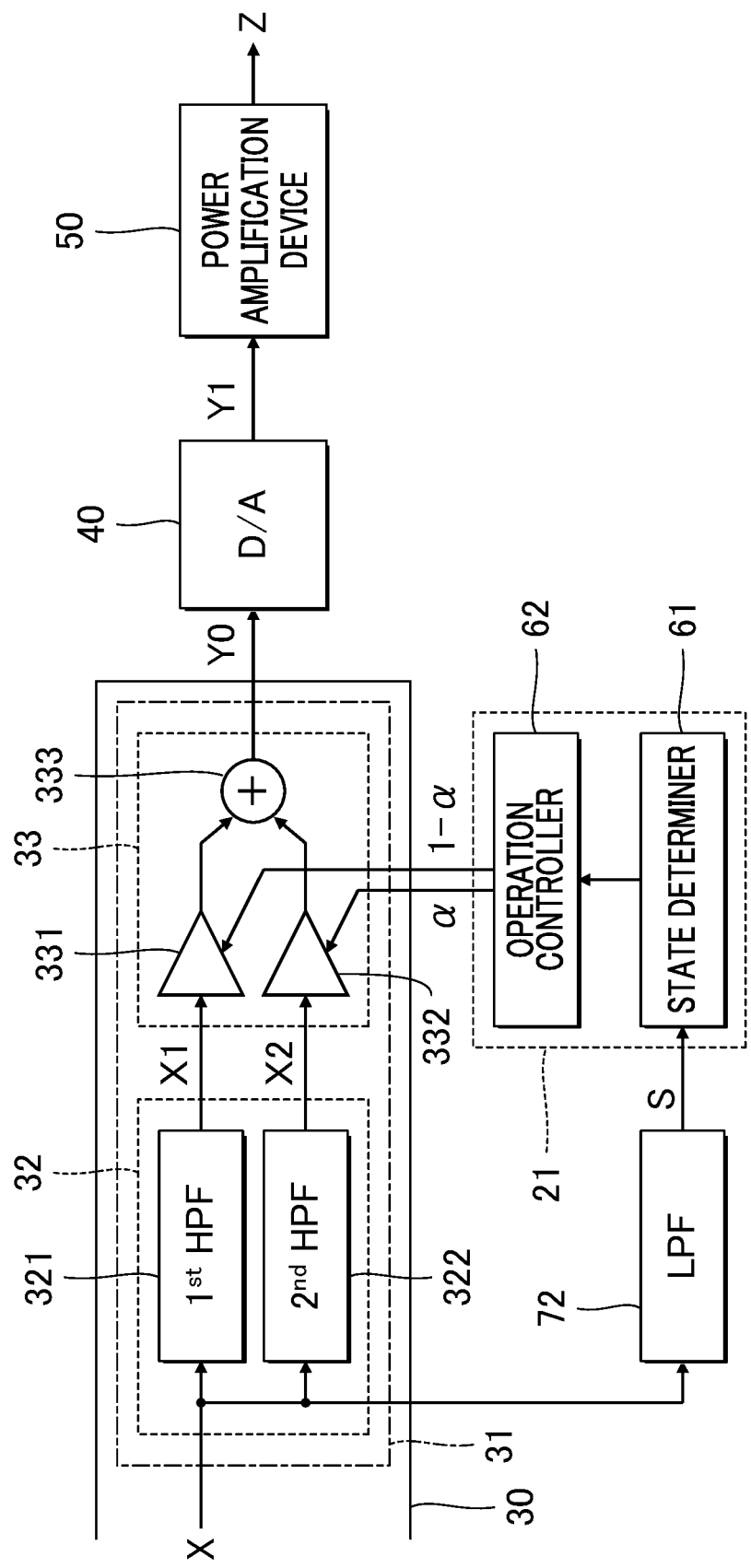
FIG. 3 is a block diagram of an element for reducing a change in a power supply voltage due to a power supply pumping phenomenon.

FIG. 3 is a block diagram of an element in the audio processing device 12 for reducing the fluctuation in the power supply voltage due to the power supply pumping phenomenon. As shown in FIG. 3, the signal processing circuit 30 according to the first embodiment includes a low-frequency reducer 31 for reducing the low-frequency component of the audio signal X. The audio signal X processed by the low-frequency reducer 31 is the same one generated by the signal processing circuit 30.

Figure 4:
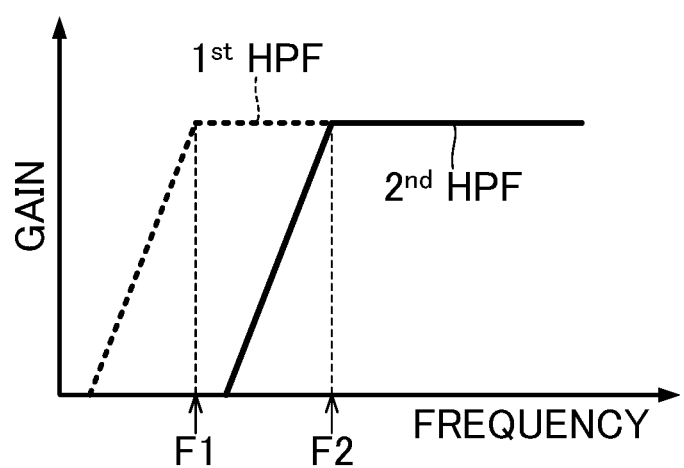
FIG. 4 is a frequency response of a first high-pass filter and a second high-pass filter.

As shown in FIG. 3, the low-frequency reducer 31 according to the first embodiment includes a signal processor 32 and an output controller 33. The signal processor 32 includes a first High-Pass Filter (HPF) 321 and a second High-Pass Filter (HPF) 322. As shown by a broken line in FIG. 4, the first high-pass filter 321 generates a first signal X1 by reducing components that fall below a first frequency F1 in the audio signal X. As shown by a solid line in FIG. 4, the second high-pass filter 322 generates a second signal X2 by reducing components that fall below a second frequency F2 in the audio signal X.

Figure 5:
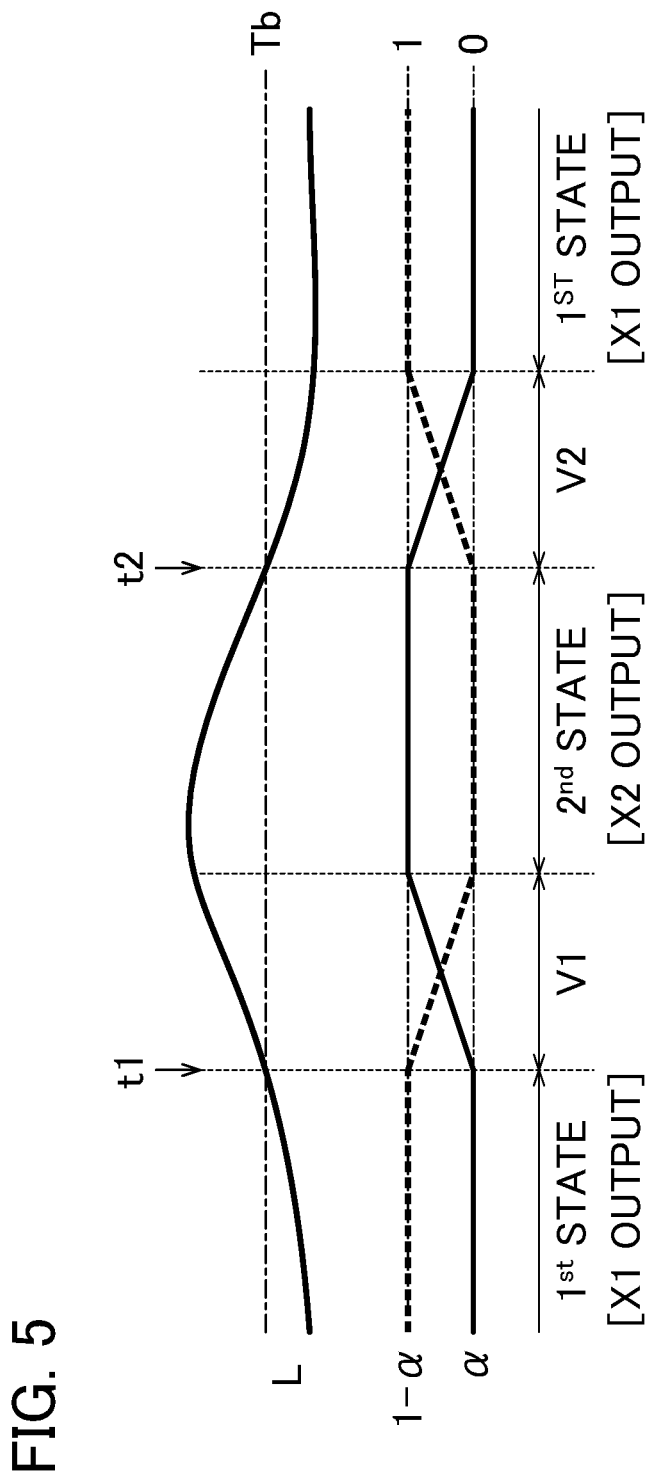
FIG. 5 is an explanatory drawing showing operations of a state determiner and an output controller.

As shown in FIG. 5, the second frequency F2 is higher than the first frequency F1 (F2>F1). For example, the first frequency F1 is set to a predetermined value within a range from 3 Hz to 20 Hz, inclusive. For example, the second frequency F2 is set to a predetermined value within a range from 20 Hz to 100 Hz, inclusive. Each of the first high-pass filter 321 and the second high-pass filter 322 is composed of, for example, a fourth-order filter. Therefore, the gradient of the attenuation band in the frequency response of the first high-pass filter 321 is 24 dB/Oct. The gradient of the attenuation band in the frequency response of the second high-pass filter 322 is also 24 dB/Oct. As will be understood from the above description, the signal processor 32 according to the first embodiment generates a first signal X1 obtained by reducing components that fall below the first frequency F1 in the audio signal X and a second signal X2 obtained by reducing components that fall below the second frequency F2 in the audio signal X. The second frequency F2 is higher than the first frequency F1.

The output controller 33 shown in FIG. 3 outputs the weighted sum of the first signal X1 generated by the first high-pass filter 321 and the second signal X2 generated by the second high-pass filter 322 as an audio signal Y0. Specifically, the output controller 33 includes a multiplier 331, a multiplier 332, and an adder 333. The multiplier 331 multiplies the first signal X1 by a weighted value (1−α). The multiplier 332 multiplies the second signal X2 by a weighted value α. The adder 333 adds an output signal from the multiplier 331 and an output signal from the multiplier 332, to generate an audio signal Y0. That is, the audio signal Y0 is expressed by the following Equation (2).

$$Y0 = (1-\alpha)X1 + \alpha \cdot X2 \quad (2)$$

The weighted value α of the second signal X2 takes a numerical value within a range from 0 to 1. The weighted value (1−α) of the first signal X1 may also fluctuate within a range from 0 to 1. As one of the weighted value α and the weighted value (1−α) increases, the other one decreases. When the weighted value α is set to 0, the output controller 33 outputs the first signal X1 as an audio signal Y0. This state will be called the "first state". On the other hand, when the weighted value α is set to 1, the output controller 33 outputs the second signal X2 as an audio signal Y0. This state will be called the "second state". By controlling the weighted value α, the output controller 33 changes from one state to another between the first state and the second state. In the second state, the output controller 33 outputs a second signal X2 having a reduced component that falls below the second frequency F2. Therefore, as compared with the first state, the low-frequency component of the audio signal Z, which is supplied from the class-D amplifier 51 to the sound output device 13, is reduced. Consequently, this allows for reduction of the fluctuation in the power supply voltage due to the power supply pumping phenomenon.

As described above with reference to the above-described Equation (1), as the frequency of the audio signal Z output from the class-D amplifier 51 is lower, the power supply pumping phenomenon is more likely to occur. Therefore, the higher the intensity (for example, volume or power) of the low-frequency component of the audio signal X supplied from the signal supply device 11, the more likely the power supply pumping phenomenon is to occur. In consideration of the above-described tendency, in the first embodiment, an audio processing device determines that there is a possibility that a power supply pumping phenomenon occurs when the intensity of the low-frequency component in the audio signal X is greater than the threshold value.

As shown in FIG. 3, the audio processing device 12 according to the first embodiment includes a Low-Pass Filter (LPF) 72. The low-pass filter 72 extracts low-frequency components that fall below a predetermined frequency in the audio signal X, to output a low-frequency signal S. That is, the low-frequency signal S represents a low-frequency component included in the audio signal X. The low-pass filter 72 generates a low-frequency signal S representing, for example, a low-frequency component that falls below the first frequency F1 or the second frequency F2 (for example, a component that falls below a suitable frequency within a range from 3 Hz to 100 Hz, inclusive). The low-pass filter 72 is incorporated in, for example, the signal processing circuit 30.

As shown in FIG. 3, the control device 21 according to the first embodiment executes a program stored in the storage device 22, whereby functions of a state determiner 61 and an operation controller 62 are realized. A part or all of the functions of the control device 21 may be realized by the signal processing circuit 30. The function of the low-pass filter 72 may also be realized by executing the program by the control device 21.

FIG. 5 is an explanatory drawing of the operation of the control device 21 (the state determiner 61 and the operation controller 62). The state determiner 61 determines whether or not a power supply pumping phenomenon occurs in the power source 52. Specifically, the state determiner 61 compares an intensity (hereinafter referred to as "low-frequency intensity") L of the low-frequency signal S generated by the low-pass filter 72 with a predetermined threshold value. Then, the state determiner 61 determines whether or not there is a possibility that a power supply pumping phenomenon occurs in accordance with the comparison result. The low-frequency intensity L takes a numerical value on an envelope generated by a known envelope filter, for example, from the low-frequency signal S. As described above, the greater the low-frequency intensity L, the more likely the power supply pumping phenomenon will occur. In consideration of the above tendency, the state determiner 61 according to the first embodiment determines that there is a possibility that a power supply pumping phenomenon occurs when the low-frequency intensity L is higher than the predetermined threshold value Tb (that is, when the low-frequency intensity L rises across the threshold value Tb).

The operation controller 62 controls the weighted value α to be applied to the generation of the audio signal Y0 by the output controller 33 in accordance with the determination result from the state determiner 61. As shown in FIG. 5, when the low-frequency intensity L rises across the threshold value Tb (time point t1), the operation controller 62 increases the weighted value α with time from the start point to the end point of the transition period V1 of the predetermined length. Specifically, in the transition period V1, the weighted value (1−α) of the first signal X linearly decreases from 1 to 0, and the weighted value α of the second signal X2 linearly increases from 0 to 1. That is, a cross-fade, in which the fade-out of the first signal X1 and the fade-in of the second signal X2 are parallel to each other, is realized. As shown above, the output controller 33 gradually changes in the transition period V1 from the first state (α=0), in which the first signal X1 is output, until the second state (α=1), in which the second signal X2 is output.

On the other hand, when the low-frequency intensity L falls across the threshold value Tb (time point t2), the operation controller 62 decreases the weighted value α with time from the start point to the end point of the transition period V2 of the predetermined length. Specifically, in the transition period V2, the weighted value (1−α) of the first signal X1 linearly increases from 0 to 1, and the weighted value α of the second signal X2 linearly decreases from 1 to 0. That is, a cross-fade, in which the fade-in of the first signal X1 and the fade-out of the second signal X2 are parallel to each other, is realized. Therefore, the output controller 33 gradually changes in the transition period V2 from the second state (α=1), in which the second signal X2 is output, until the first state (α=0), in which the first signal X1 is to output. The time lengths of the transition period V1 and the transition period V2 are freely selectable. For example, the transition period V2 may be set to a length that is longer than the transition period V1. Specifically, the transition period V1 is set to a time length of, for example, 10 milliseconds or less. The transition period V2 is set to a time length of, for example, 100 milliseconds or less.

Figure 6:
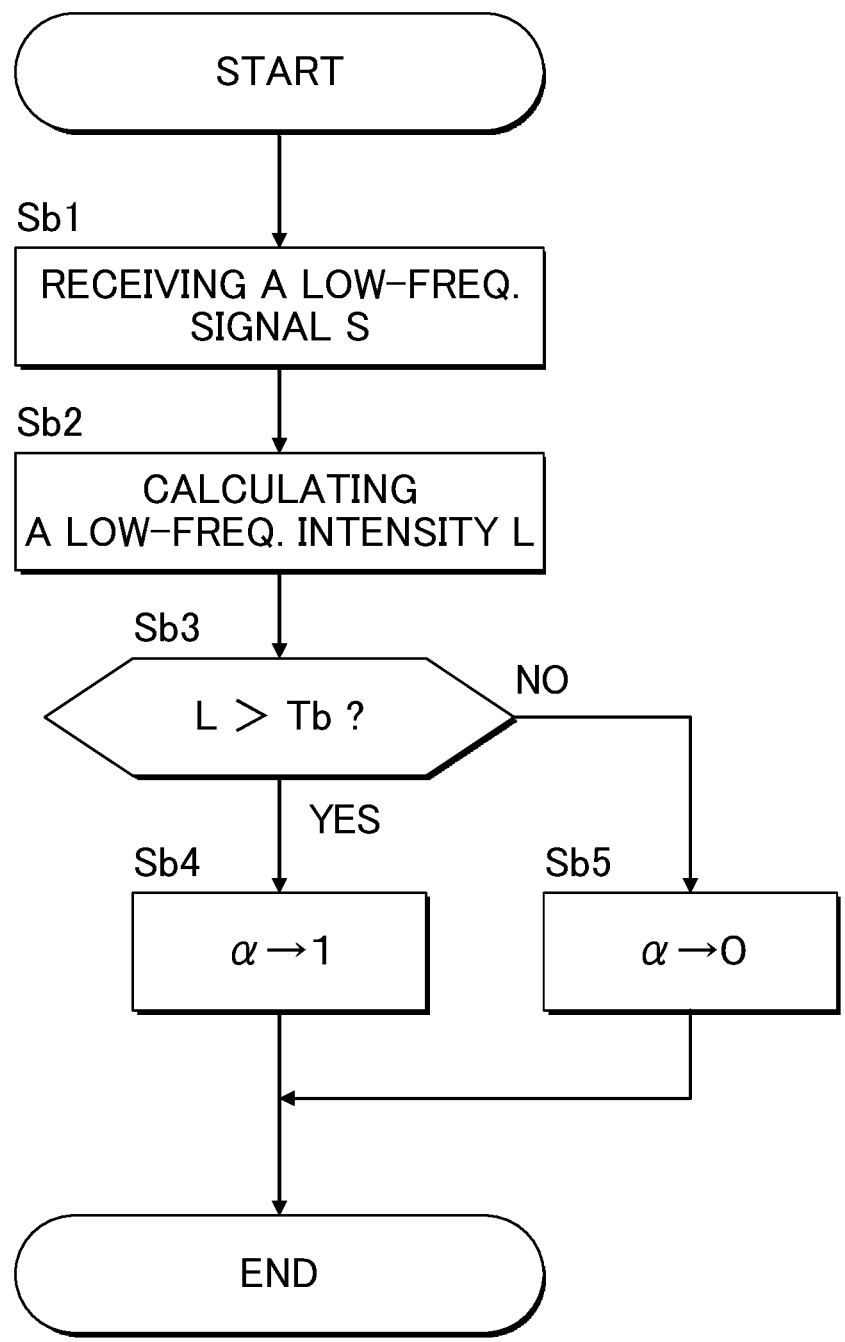
FIG. 6 is a flowchart of an operation performed by a control device.

FIG. 6 is a flowchart of operations performed by the control device 21 (the state determiner 61 and the operation controller 62). For example, the processing shown in FIG. 6 starts when it is triggered by an interrupt occurring at a predetermined cycle. When the processing shown in FIG. 6 is started, the state determiner 61 receives the low-frequency signal S output from the low-pass filter 72 (Sb1), and calculates the low-frequency intensity L (Sb2).

The state determiner 61 determines whether or not the low-frequency intensity L exceeds the threshold value Tb (Sb3). When the low-frequency intensity L exceeds the threshold value Tb (Sb3: YES), that is, when there is a possibility that a power supply pumping phenomenon occurs, the operation controller 62 executes processing for setting the weighted value α to 1 (Sb4). That is, the processing for controlling the output controller 33 to be in the second state is executed. Specifically, when the output controller 33 is already in the second state (α=1), the operation controller 62 maintains the weighted value α at 1. When the output controller 33 is in the first state (α=0), as shown in FIG. 5, the operation controller 62 changes the weighted value α from 0 to 1 over time from the start point to the end point of the transition period V1 of the predetermined length. That is, the output controller 33 changes from the first state to the second state.

On the other hand, when it is estimated that the low-frequency 5s intensity L is below the threshold value Tb (Sb3: NO), that is, when the power supply pumping phenomenon does not occur, the operation controller 62 executes processing for setting the weighted value α to 0 (Sb5). That is, the processing for controlling the output controller 33 to the first state is executed. Specifically, when the output controller 33 is already in the first state (α=0), the operation controller 62 maintains the weighted value α at 0. On the other hand, when the output controller 33 is in the second state (α=1), as shown in FIG. 5, the operation controller 62 reduces the weighted value α from 1 to 0 over time from the start point to the end point of the transition period V2 of the predetermined length. That is, the output controller 33 changes from the second state to the first state.

As described above, the output controller 33 is controlled to be in the first state when the determination result from the state determiner 61 is negative (when there is no possibility that the power supply pumping phenomenon occurs). On the other hand, the output controller 33 is controlled to be in the second state when the determination result from the state determiner 61 is affirmative (when there is a possibility that the power supply pumping phenomenon occurs). In the second state, since the second signal X2, which is obtained by reducing components that fall below the second frequency F2, which is higher than the first frequency F1, is output from the output controller 33, there is reduced fluctuation in the power supply voltage due to the power supply pumping phenomenon as compared with the first state.

In the first embodiment, when the intensity (low-frequency intensity L) of the low-frequency component in the audio signal X exceeds the threshold value Tb, it is determined that there is a possibility that a power supply pumping phenomenon occurs. Therefore, even when the power supply pumping phenomenon is not actually generated, it is possible to execute processing for reducing fluctuations in the power supply voltage due to the power supply pumping phenomenon (processing for controlling the output controller 33 to the second state). That is, according to the first embodiment, it is possible to prevent fluctuations in the power supply voltage due to a power supply pumping phenomenon.

Further, in the first embodiment, since the output controller 33 changes from one state to another between the first state and the second state, it is not necessary to change the cutoff frequency of the high-pass filter for processing the audio signal X according to the presence or absence of the power supply pumping phenomenon. Specifically, in the first embodiment, there is reduction in fluctuation of the power supply voltage due to the power supply pumping phenomenon by the very simple control for changing one weighted value α. Therefore, there is an advantage in that there is reduction of load that is applied to the audio processing device 12 and the like to reduce fluctuation in the power supply voltage due to the power supply pumping phenomenon as compared with the technique of Patent Document 1 in which the cutoff frequency of the high-pass filter is changed.

Due to the difference in frequency response between the first high-pass filter 321 and the second high-pass filter 322 (in particular, phase characteristic), there is a possibility that phases of the first signal X1 and the second signal X2 may be different from each other. Therefore, in the configuration in which the first signal X1 and the second signal X2 are selectively switched by the output controller 33, the level of the audio signal Y0 output from the output controller 33 may fluctuate discontinuously at the time of switching, which may cause noise (for example, a noise "puff"). In the first embodiment, the weighted value α of the second signal X2 decreases over time in parallel to the increase in the weighted value (1−α) of the first signal X1 over time. On the other hand, the weighted value α of the second signal X2 increases over time in parallel to the decrease in the weighted value (1−α) of the first signal X1 over time. That is, the first signal X1 and the second signal X2 are crossfaded. Therefore, the first embodiment provides another advantage that there is reduced noise caused by a difference in phase between the first signal X1 and the second signal X2.

Second Embodiment

A second embodiment according to the present invention will be described. In the embodiments shown in the following, elements having the same actions and functions as in the first embodiment are denoted by the same respective reference numerals as used for like elements in the description of the first embodiment, and detailed description thereof is omitted where appropriate.

Figure 7:
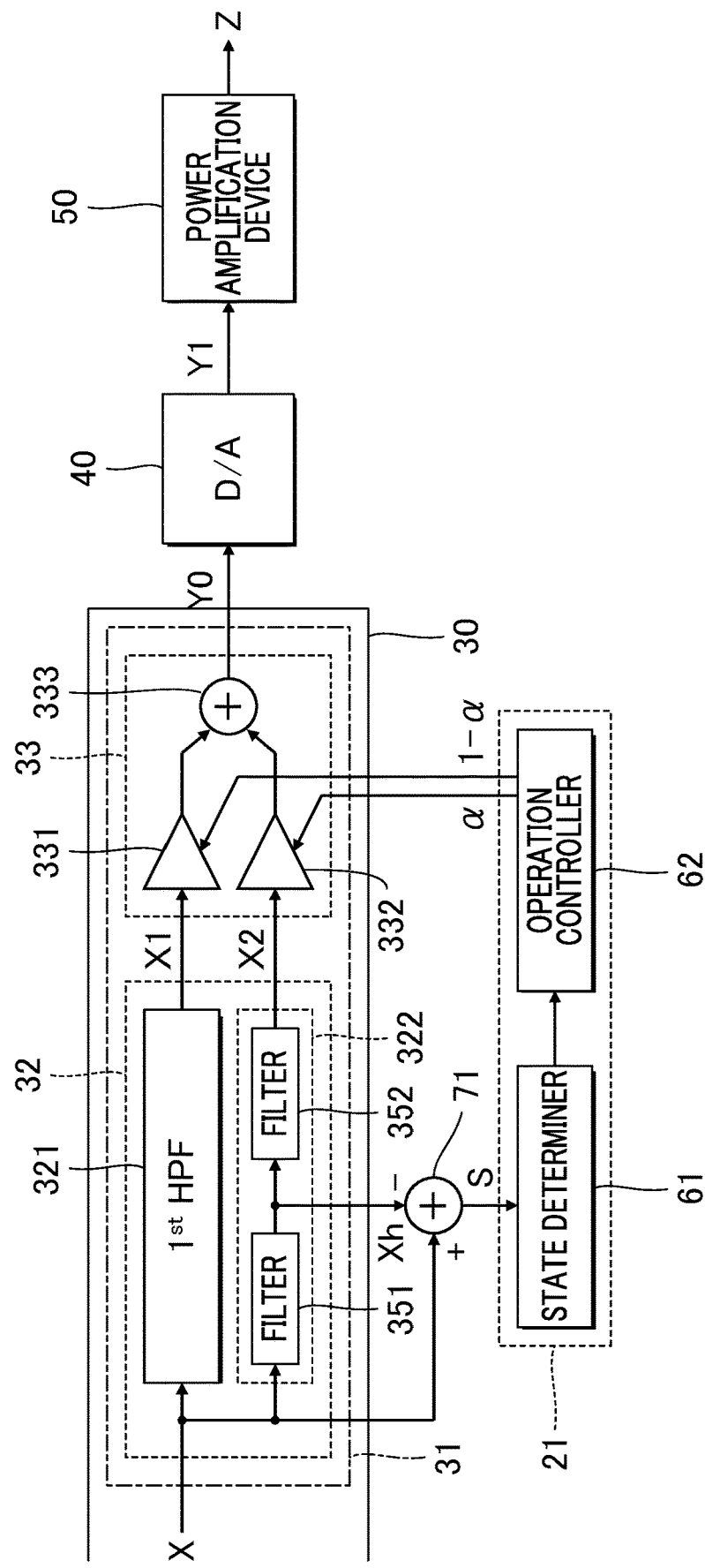
FIG. 7 is a block diagram of an audio processing device according to a second embodiment.

FIG. 7 is a block diagram of elements for reducing fluctuation in power supply voltage due to the power supply pumping phenomenon in the audio processing device 12 according to the second embodiment. Similarly to the first embodiment, the second high-pass filter 322 of the signal processor 32 in the second embodiment outputs the second signal X2 by reducing the components that fall below the second frequency F2 in the audio signal X. As shown in FIG. 7, the second high-pass filter 322 is a fourth-order filter consisting of a second-order filter 351 and a second-order filter 352. The second signal X2 output from the downstream filter 352 is supplied to the output controller 33.

As shown in FIG. 7, the audio processing device 12 according to the first embodiment includes a subtractor circuit 71. The subtractor circuit 71 subtracts the high-frequency signal Xh, which is output from the filter 351 of the second high-pass filter 322, from the audio signal X before processing by the second high-pass filter 322, to generate a low-frequency signal S. The high-frequency signal Xh output from the filter 351 corresponds to a high-frequency component that is higher than the second frequency F2 of the audio signal X. Therefore, the low-frequency signal S generated by subtracting the high-frequency signal Xh from the audio signal X corresponds to a low-frequency component that falls below the second frequency F2 of the audio signal X. It is also possible to supply the second signal X2 output from the second high-pass filter 322 (filter 352) to the subtractor circuit 71 as the high-frequency signal Xh.

The following operations (a) and (b) are the same as those in the first embodiment. (a) The operation in which the state determiner 61 determines whether or not there is a possibility that a power supply pumping phenomenon occurs according to intensity (low-frequency intensity L) of a low-frequency signal S. (b) The operation in which the operation controller 62 controls the weighted value α in accordance with the determination result from the state determiner 61. Therefore, the second embodiment achieves the same effects as those of the first embodiment. In the second embodiment, the second high-pass filter 322 (filter 351) for generating the second signal X2 from the audio signal X is used to generate the low-frequency signal S used for determining the power supply pumping phenomenon. Therefore, there is an advantage in that the configuration of the audio processing device 12 is simplified, as compared with the configuration of the audio processing device according to the first embodiment that generates the low-frequency signal S using the low-pass filter 72 that is separate from the second high-pass filter 322.

Third Embodiment

Figure 8:
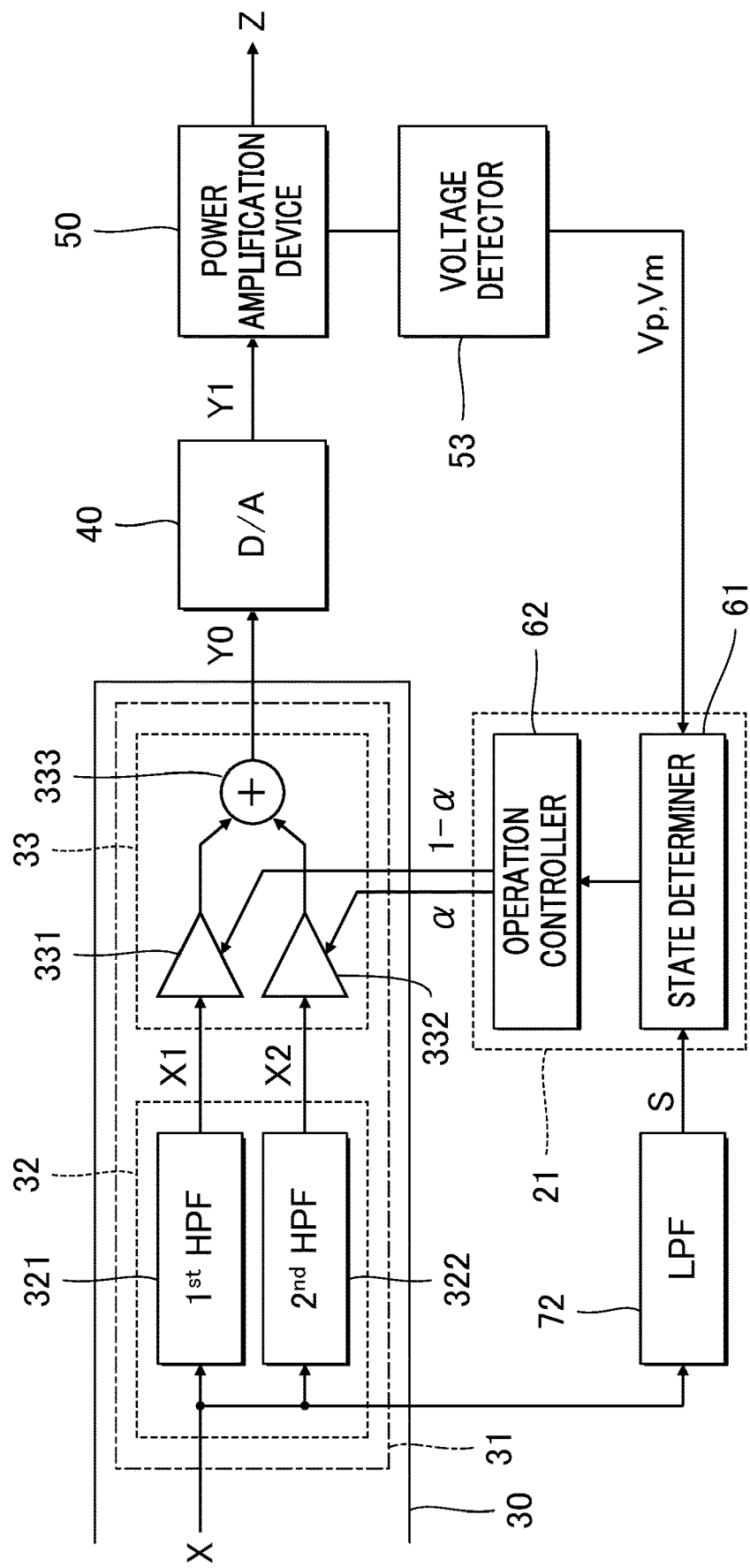
FIG. 8 is a block diagram of an audio processing device according to a third embodiment.

FIG. 8 is a block diagram of elements in the audio processing device 12 according to the third embodiment for reducing fluctuation in power supply voltage due to a power supply pumping phenomenon. As shown in FIG. 8, the audio processing device 12 according to the third embodiment has a configuration in which the voltage detector 53 is added to the same elements as those in the first embodiment. The voltage detector 53 detects the positive power supply voltage Vp and the negative power supply voltage Vm supplied to the class-D amplifier 51 by a power source 52 of the power amplification device 50. Specifically, the voltage detector 53 is configured to include an A/D converter (not shown) configured to generate digital data representing, for example, each of the positive power supply voltage Vp and the negative power supply voltage Vm.

The state determiner 61 according to the third embodiment determines whether or not there is a possibility that a power supply pumping phenomenon occurs in accordance with the low-frequency intensity L of the audio signal X (hereinafter referred to as the "first determination"). Furthermore, the state determiner 61 determines whether or not there is an on-going power supply pumping phenomenon (hereinafter referred to as the "second determination") in accordance with the positive power supply voltage Vp and the negative power supply voltage Vm detected by the voltage detector 53. Specifically, in the second determination, the state determiner 61 compares the voltage index value Q, which corresponds to the positive power supply voltage Vp and the negative power supply voltage Vm, with a threshold value to determine whether or not there is a power supply pumping phenomenon.

Figure 9:
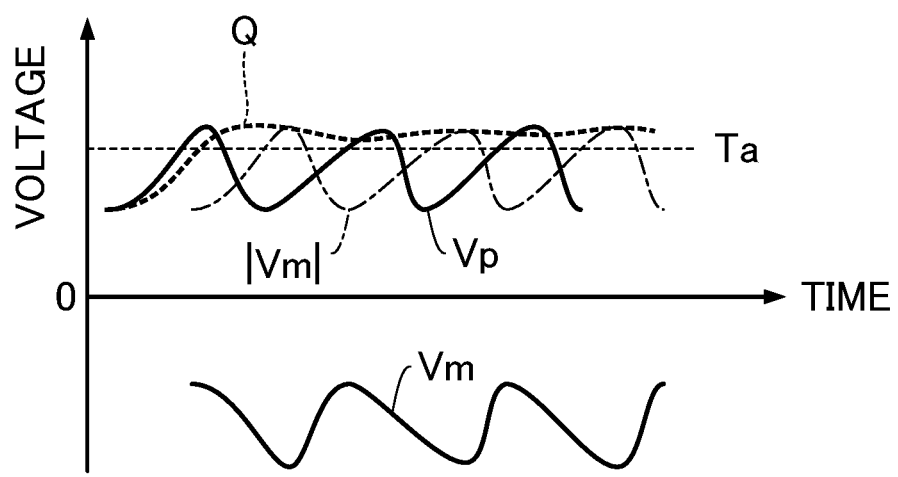
FIG. 9 is an explanatory drawing of a power supply voltage and a voltage index value.

FIG. 9 shows time changes of the positive power supply voltage Vp, the negative power supply voltage Vm, and the voltage index value Q. As shown in FIG. 9, the voltage index value Q takes a value obtained by smoothing the larger one of the positive power supply voltage Vp and the absolute value |Vm| of the negative power supply voltage Vm (maximum value max {Vp, |Vm|}) on a time axis. For example, the state determiner 61 calculates the value on the envelope generated by a known envelope filter from the time series of the maximum value max {Vp, |Vm|}, as the voltage index value Q.

As will be understood from the above description, as the positive power supply voltage Vp or the negative power supply voltage Vm fluctuates from a predetermined value by a power supply pumping phenomenon, the voltage index value Q takes a larger numerical value. That is, it is possible to determine that the larger the voltage index value Q, the higher the probability of the power supply pumping phenomenon. The state determiner 61 according to the third embodiment determines that the power supply pumping phenomenon has occurred when a voltage index value Q is higher than a threshold value Ta, and determines that the power supply pumping phenomenon has been eliminated when the voltage index value Q is lower than the threshold value Ta. The threshold value Ta is set to a predetermined value exceeding the voltage index value Q observed in a state in which the power supply pumping phenomenon does not occur.

The operation controller 62 according to the third embodiment controls the output controller 33 in accordance with the result of the first determination using the low-frequency intensity L and the result of the second determination using the voltage index value Q. Specifically, the operation controller 62 controls the output controller 33 to be in the second state when at least one of the results of the first determination and the second determination is affirmative, and controls the output controller 33 to be in the first state when both the results of the first determination and the second determination are negative.

Also the third embodiment achieves the same effects as those of the first embodiment. Furthermore, in the third embodiment, in addition to the above-mentioned first determination, the second determination is executed. In the first determination, the state determiner 61 determines whether or not there is a possibility that a power supply pumping phenomenon occurs in accordance with the low-frequency intensity L. In a second determination, the state determiner 61 determines whether or not there is an on-going power supply pumping phenomenon in accordance with the voltage index value Q. Therefore, there is an advantage in that there is effective reduction in fluctuation in the power supply voltage due to the power supply pumping phenomenon as compared with the first embodiment in which only the first determination is performed. In the second embodiment, the second high-pass filter 322 (filter 351) and the subtractor circuit 71 are used to generate the low-frequency signal S. This configuration of the second embodiment is also applicable to the third embodiment as well.

Fourth Embodiment

Figure 10:
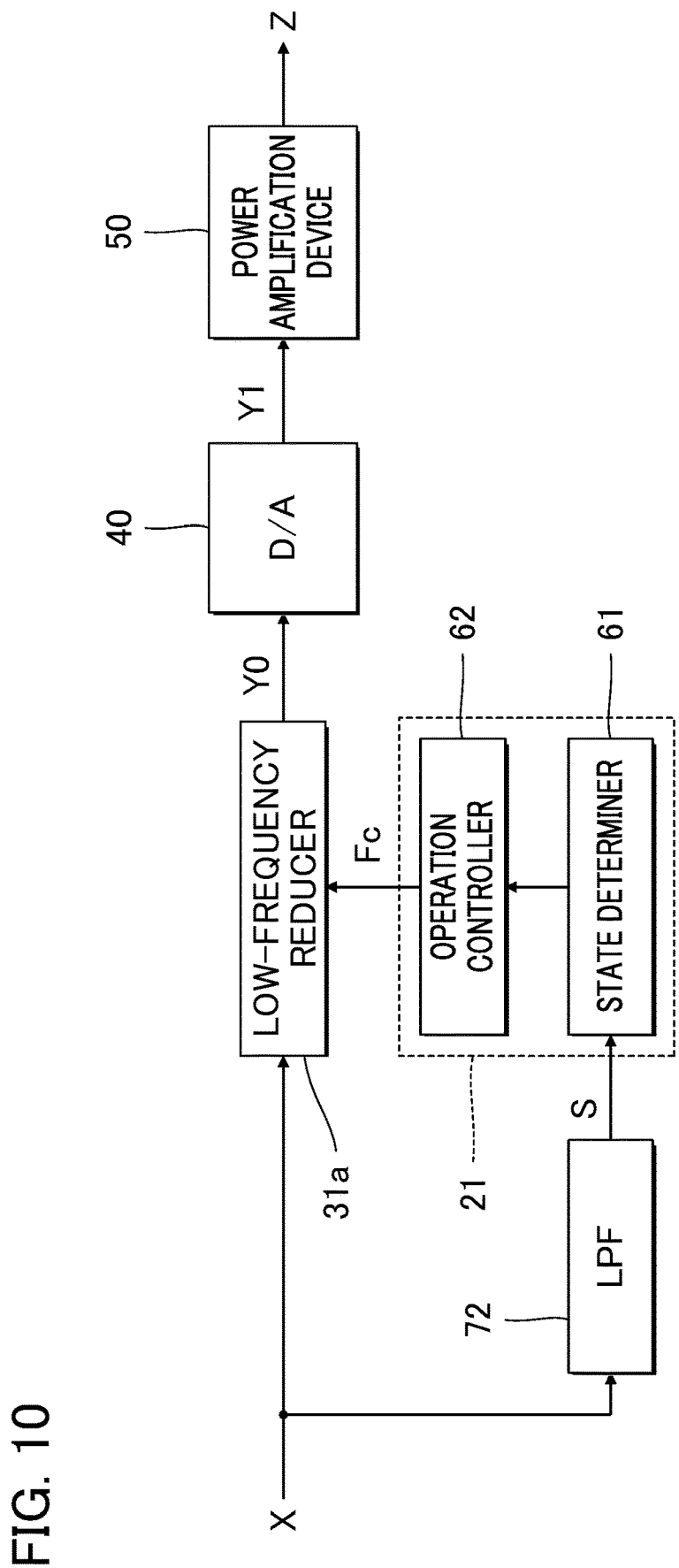
FIG. 10 is a block diagram of an audio processing device according to a fourth embodiment.

FIG. 10 is a block diagram of elements for reducing fluctuation in power supply voltage due to a power supply pumping phenomenon in the audio processing device 12 according to the fourth embodiment. As shown in FIG. 10, in the audio processing device 12 according to the fourth embodiment, the low-frequency reducer 31 (the signal processor 32 and the output controller 33) according to the first embodiment is replaced by the low-frequency reducer 31a shown in FIG. 10. The low-frequency reducer 31a is a high-pass filter for reducing components that fall below the cutoff frequency Fc in the audio signal X.

The cutoff frequency Fc of the low-frequency reducer 31a is variable. When the cutoff frequency Fc is set to the first frequency F1, the low-frequency reducer 31a turns to be in the first state in which an audio signal Y0 obtained by reducing components that fall below the first frequency F1 in the audio signal X is output. On the other hand, when the cutoff frequency Fc is set to the second frequency F2, the low-frequency reducer 31a turns to be in the second state in which the audio signal Y0 obtained by reducing components that fall below the second frequency F2 in the audio signal X is output. The low-frequency reducer 31a changes from one state to another between the first state and the second state under the control of the operation controller 62. In the second state, the low-frequency reducer 31a outputs the audio signal Y0 obtained by reducing components that fall below the second frequency F2, which is higher than the first frequency F1. Accordingly, there is reduced fluctuation in the power supply voltage due to the power supply pumping phenomenon as compared with the first state.

Similarly to the first embodiment, the state determiner 61 determines whether or not the low-frequency intensity L of the audio signal X exceeds the threshold value Tb (that is, whether or not there is a possibility that a power supply pumping phenomenon occurs). The operation controller 62 according to the fourth embodiment controls the cutoff frequency Fc of the low-frequency reducer 31a in accordance with the determination result from the state determiner 61.

Specifically, when the low-frequency intensity L is higher than the threshold value Tb (when there is a possibility that a power supply pumping phenomenon occurs), the operation controller 62 raises the cutoff frequency Fc from the first frequency F1 to the second frequency F2. For example, the operation controller 62 increases the cutoff frequency Fc stepwise from the first frequency F1 to the second frequency F2 by a predetermined value. On the other hand, when the low-frequency intensity L is lower than the threshold value Tb (when it is estimated that the power supply pumping phenomenon does not occur), the operation controller 62 lowers the cutoff frequency Fc from the second frequency F2 to the first frequency F1. For example, the operation controller 62 increases the cutoff frequency Fc stepwise from the second frequency F2 to the first frequency F1 by a predetermined value. As will be understood from the above description, similarly to the operation controller 62 according to the first embodiment, the operation controller 62 of the fourth embodiment controls the low-frequency reducer 31a to the first state when the determination result from the state determiner 61 is negative, and controls the low-frequency reducer 31a to be in the second state when the determination result from the state determiner 61 is affirmative.

As shown above, in the fourth embodiment, when the low-frequency intensity L in the audio signal X exceeds the threshold value Tb, the state determiner 61 determines that there is a possibility that a power supply pumping phenomenon occurs. Therefore, even when the power supply pumping phenomenon is not actually generated, there can be executed processing for reducing fluctuations in the power supply voltage due to the power supply pumping phenomenon (processing for increasing the cutoff frequency Fc to the second frequency F2). That is, the fourth embodiment allows for reduction of (and ideally prevention of) fluctuation in the power supply voltage due to the power supply pumping phenomenon in advance in the same manner as in the first embodiment.

In the second embodiment, the second high-pass filter 322 and the subtractor circuit 71 are used to generate the low-frequency signal S. The configuration of the second embodiment may be also applicable to the fourth embodiment. Furthermore, in the third embodiment, the low-frequency reducer 31 is controlled in accordance with the result of the first determination using the low-frequency intensity L and the result of the second determination using the voltage index value Q. This configuration of the third embodiment may also be applicable to the fourth embodiment.

Modifications

The embodiments described above may be modified in various ways. Examples of specific modifications will now be described. Two or more modes selected freely among the following may also be combined.

(1) In the first embodiment to the third embodiment, the first signal X1 and the second signal X2 are cross-faded. However, in a case in which noise due to the phase difference between the first signal X1 and the second signal X2 does not cause a particular problem, the output controller 33 may selectively output the first signal X1 and the second signal X2 as the audio signal Y0. That is, it is possible to omit the calculation of the weighted sum of the first signal X1 and the second signal X2 and the cross fade between the first signal X and the second signal X2.

For example, there is used, as the output controller 33, a switch for selecting either of the first signal X and the second signal X2. The operation controller 62 controls the output controller 33 so that when the determination result from the state determiner 61 is affirmative, the output controller 33 is in the first state in which the first signal X1 is output, and when the determination result is negative, the output controller 33 is in the second state in which the second signal X2 is output. Also, in the above configuration, as compared with the technique of Patent Document 1 in which the cutoff frequency of the high-pass filter is changed, there is reduction of load that is applied to the audio processing device and the like to reduce fluctuation in the power supply voltage due to the power supply pumping phenomenon. As will be understood from the above description, the operation controller 62 according to the aspect of the present invention is expressed comprehensively as an element configured to control the output controller 33 to be in the first state when the determination result from the state determiner 61 is negative, and control the output controller 33 to be in the second state when the determination result is affirmative. There is basically preferred an audio processing device that is configured to gradually change from one state to another between the first state and the second state. However, the audio processing device may instantaneously change from one state to another between the first state and the second state.

Figure 11:
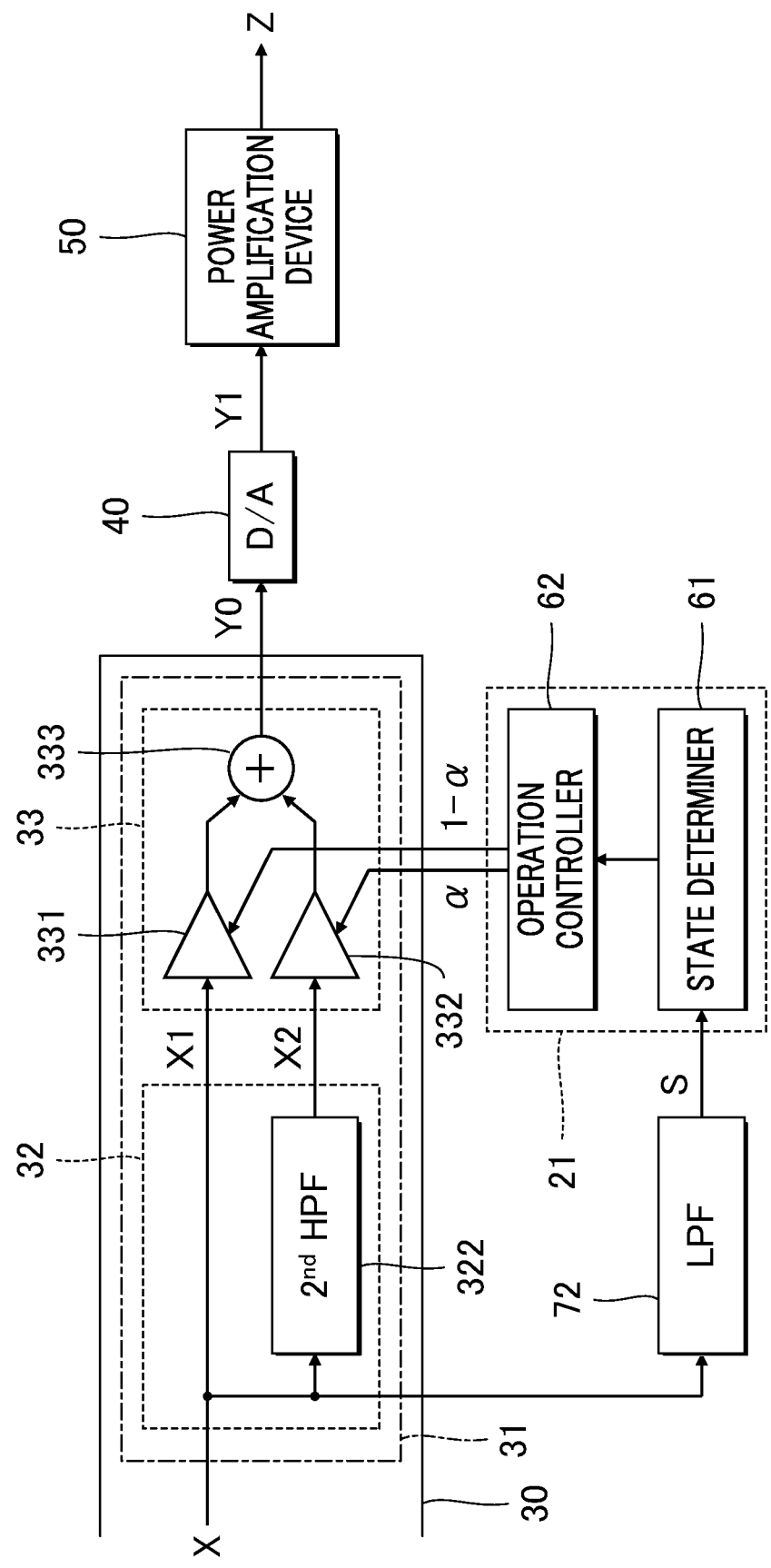
FIG. 11 is a block diagram of an audio processing device according to a modification.

(2) In first embodiment to the third embodiment, the signal processor 32 is provided with the first high-pass filter 321 and the second high-pass filter 322, but the first high-pass filter 321 may be omitted. For example, in an audio processing device configured to reduce components that fall below the first frequency F in the signal processing before the processing by the low-frequency reducer 31, the first high-pass filter 321 is omitted from the low-frequency reducer 31, as shown in FIG. 11. That is, the output controller 33 receives a supply of the audio signal X, as an audio signal X1, having reduced components that fall below the first frequency F1.

(3) In the second embodiment, a part (filter 351) of the second high-pass filter 322 is used both for generating the second signal X2 and for generating the low-frequency signal S. However the configuration in which the signal processor 32 is used for generating the low-frequency signal S is not limited to the above example. The subtractor circuit 71 may receive a supply of the first signal X1 generated by the first high-pass filter 321 as the high-frequency signal Xh. Alternatively, the subtractor circuit 71 may receive a supply of a signal generated by some of filters constituting first-order high-pass filters 321 (for example, a filter other than the last stage) as the high-frequency signal Xh. In the above configuration, the low-frequency signal S, which represents a low-frequency component that falls below the first frequency F1, is generated by the subtractor circuit 71.

(4) in the first embodiment to the third embodiment, the weighted value (1−α) of the first signal X and the weighted value α of the second signal X2 linear vary; however, the aspects of the variation of the weighted value α and the weighted value (1−α) is not limited to the above example. Specifically, each of the weighted value α and the weighted value (1−α) may also be changed in a curved manner. In each of the above-described embodiments, the weighted value α is changed from 0 to 1; however, the minimum value of the weighted value α (an example of the second value) and the maximum value (an example of the first value) are not limited to the above examples. For example, the minimum value of the weighted value α may be set to a positive number close to 0 (for example, 0.1). Alternatively, for example, the maximum value of the weighted value α may be set to a value close to 1 (for example, 0.9).

(5) For example, the following aspect is understood from the foregoing embodiments.

Aspect 1

An audio processing device according to an aspect (Aspect 1) of the present invention includes: a signal processing circuit configured to select between a first state for outputting a first signal obtained by reducing components that fall below a first frequency in an audio signal and a second state for outputting a second signal obtained by reducing components that fall below a second frequency in the audio signal, and output one of the selected first or second signal as an output signal, where the second frequency is higher than the first frequency; a class-D amplifier that amplifies the output signal; a processor configured to: determine whether or not an intensity of a low-frequency component in the audio signal exceeds a threshold value; and control the signal processing circuit to select: the first state in a case where a determination result is negative, where the intensity of the low-frequency component in the audio signal is determined to not exceed the threshold value; and the second state in a case where the determination result is affirmative, where the intensity of the low-frequency component in the audio signal is determined to exceed the threshold value.

In the aspect described above, it is determined whether or not the intensity of the low-frequency component in the audio signal exceeds a threshold value (that is, whether or not there is a possibility that a power supply pumping phenomenon occurs). Accordingly, there is executed the processing for reducing the fluctuation in the power supply voltage due to the power supply pumping phenomenon (processing for controlling the output controller to enter the second state) even when the power supply pumping phenomenon does not actually occur. Therefore, there is an advantage in that there is reduced (ideally, avoided) fluctuation in the power supply voltage due to the power supply pumping phenomenon.

Aspect 2

In the example of Aspect 1 (Aspect 2), the signal processing circuit includes: a high-pass filter configured to reduce components that fall below the second frequency in the audio signal; and an output controller configured to select between the first state and the second state, in which, in the second state, the output controller outputs the output signal from the high-pass filter, and in which, the audio processing device further comprises a subtractor circuit configured to subtract, from the audio signal, the output signal from the high-pass filter to generate a signal having the low-frequency component.

Therefore, there is an advantage in that the configuration of the audio processing device is simplified as compared with a configuration of generating a signal of a low-frequency component for determining a power supply pumping phenomenon by an element separate from the high-pass filter.

Aspect 3

An aspect (Aspect 3) of the present invention provides a method of controlling an audio processing device including: a signal processing circuit configured to select between a first state for outputting a first signal obtained by reducing components that fall below a first frequency in an audio signal and a second state for outputting a second signal obtained by reducing components that fall below a second frequency in the audio signal, and output one of the selected first or second signal as an output signal, where the second frequency is higher than the first frequency; and a class-D amplifier that amplifies the output signal, wherein the method comprises: determining whether or not the intensity of a low-frequency component in the audio signal exceeds a threshold value, and controlling the signal processing circuit to select the first state in a case where a determination result is negative, where the intensity of the low-frequency component in the audio signal is determined to not exceed the threshold value; and to select the second state in a case where the determination result is affirmative, where the intensity of the low-frequency component in the audio signal is determined to exceed the threshold value.

In the aspect described above, since it is determined whether or not the intensity of the low-frequency component in the audio signal exceeds a threshold value (that is, whether or not there is a possibility that a power supply pumping phenomenon occurs). Accordingly, there is executed the processing for reducing fluctuation in the power supply voltage due to the power supply pumping phenomenon (processing for controlling the output controller to enter the second state) even when the power supply pumping phenomenon does not actually occur. Therefore, there is an advantage in that there is reduced (ideally, avoided) fluctuation in the power supply voltage due to the power supply pumping phenomenon.

In the example of Aspect 3 (Aspect 4), the signal processing circuit includes: a high-pass filter configured to reduce components that fall below the second frequency in the audio signal; and an output controller configured to select between the first state and the second state, in which, in the second state the output controller outputs the output signal from the high-pass filter, and in which, the audio processing device further comprises a subtractor circuit configured to subtract, from the audio signal, the output signal from the high-pass filter to generate a signal having the low-frequency component.

DESCRIPTION OF REFERENCE SIGNS

100 audio system;
11 signal supply device;
12 audio processing device;
13 sound output device;
20 control unit;
21 control device;
22 storage device;
51 class-D amplifier,
511 modulation circuit;
512 switching circuit;
513 low-pass filter;
52 power source;
521, 522 constant-voltage power supply;
523, 524 smoothing capacitor;
31, 31a low-frequency reducer;
32 signal processor;
321 first high-pass filter;
322 second high-pass filter,
33 output controller;
331, 332 multiplier,
333 adder;
61 state determiner;
62 operation controller,
71 subtractor circuit;
72 low-pass filter

What is claimed is:
1. An audio processing device comprising:
a signal processing circuit configured to select between a first state for outputting a first signal obtained by reducing components that fall below a first frequency in an audio signal and a second state for outputting a second signal obtained by reducing components that fall below a second frequency in the audio signal, and output one of the selected first or second signal as an output signal, where the second frequency is higher than the first frequency;

a class-D amplifier that amplifies the output signal;

a processor configured to:

determine whether or not an intensity of a low-frequency component in the audio signal exceeds a threshold value; and control the signal processing circuit to select:
- the first state in a case where a determination result is negative, where the intensity of the low-frequency component in the audio signal is determined to not exceed the threshold value; and
- the second state in a case where the determination result is affirmative, where the intensity of the low-frequency component in the audio signal is determined to exceed the threshold value.

2. The audio processing device according to claim 1, wherein the signal processing circuit includes:
- a high-pass filter configured to reduce components that fall below the second frequency in the audio signal; and
- an output controller configured to select between the first state and the second state,
- wherein, in the second state, the output controller outputs the output signal from the high-pass filter, and
- wherein the audio processing device further comprises a subtractor circuit configured to subtract, from the audio signal, the output signal from the high-pass filter to generate a signal having the low-frequency component.

3. A method of controlling an audio processing device, the audio processing device including:
- a signal processing circuit configured to select between a first state for outputting a first signal obtained by reducing components that fall below a first frequency in an audio signal and a second state for outputting a second signal obtained by reducing components that fall below a second frequency in the audio signal, and output one of the selected first or second signal as an output signal, where the second frequency is higher than the first frequency; and
- a class-D amplifier that amplifies the output signal, wherein the method comprises:
- determining whether or not the intensity of a low-frequency component in the audio signal exceeds a threshold value, and
- controlling the signal processing circuit to select the first state in a case where a determination result is negative, where the intensity of the low-frequency component in the audio signal is determined to not exceed the threshold value; and
- controlling the signal processing circuit to select the second state in a case where the determination result is affirmative, where the intensity of the low-frequency component in the audio signal is determined to exceed the threshold value.

4. The method according to claim 3, wherein the signal processing circuit includes:
- a high-pass filter configured to reduce components that fall below the second frequency in the audio signal; and
- an output controller configured to select between the first state and the second state,
- wherein in the second state the output controller outputs the output signal from the high-pass filter, and
- wherein the audio processing device further comprises a subtractor circuit configured to subtract, from the audio signal, the output signal from the high-pass filter to generate a signal having the low-frequency component.

* * * * *